(12) United States Patent
Izumi

(10) Patent No.: US 8,476,702 B2
(45) Date of Patent: Jul. 2, 2013

(54) SEMICONDUCTOR DEVICE

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 142 days.

(21) Appl. No.: 12/238,556

(22) Filed: Sep. 26, 2008

(65) Prior Publication Data
US 2009/0096018 A1    Apr. 16, 2009

(30) Foreign Application Priority Data

Sep. 28, 2007 (JP) ................................ 2007-255345

(51) Int. Cl.
*H01L 29/66* (2006.01)
*H01L 29/78* (2006.01)

(52) U.S. Cl.
USPC ............... 257/331; 257/332; 257/E29.257; 257/E29.26

(58) Field of Classification Search
None
See application file for complete search history.

(56) References Cited

U.S. PATENT DOCUMENTS

| | | | | |
|---|---|---|---|---|
| 6,060,747 A * | 5/2000 | Okumura et al. | .............. | 257/331 |
| 6,165,822 A * | 12/2000 | Okuno et al. | .............. | 438/142 |
| 6,452,228 B1 * | 9/2002 | Okuno et al. | .............. | 257/329 |
| 6,576,955 B2 * | 6/2003 | Kubo | .............. | 257/332 |
| 6,916,712 B2 * | 7/2005 | Kocon et al. | .............. | 438/270 |
| 7,052,963 B2 * | 5/2006 | Williams et al. | .............. | 438/268 |
| 7,075,147 B2 * | 7/2006 | Cao | .............. | 257/331 |
| 7,897,461 B2 * | 3/2011 | Takami | .............. | 438/270 |
| 8,026,550 B2 * | 9/2011 | Sutardja | .............. | 257/341 |
| 2002/0043684 A1 * | 4/2002 | Kubo | .............. | 257/327 |
| 2005/0006700 A1 * | 1/2005 | Cao | .............. | 257/328 |
| 2005/0161735 A1 * | 7/2005 | Aoki et al. | .............. | 257/330 |
| 2009/0072304 A1 * | 3/2009 | Adan | .............. | 257/330 |

FOREIGN PATENT DOCUMENTS

| JP | 11-330469 A | 11/1999 |
|---|---|---|
| JP | 2007-042892 | 2/2007 |

* cited by examiner

*Primary Examiner* — Hoang-Quan Ho
(74) *Attorney, Agent, or Firm* — Rabin & Berdo, P.C.

(57) ABSTRACT

A semiconductor device according to the present invention includes: a body region of a first conductive type; trenches formed by digging in from a top surface of the body region; gate electrodes embedded in the trenches; source regions of a second conductive type formed at sides of the trenches in a top layer portion of the body region; and body contact regions of the first conductive type, penetrating through the source regions in a thickness direction and contacting the body region. The body contact regions are formed in a zigzag alignment in a plan view. With respect to a column formed by the body contact regions aligned in a predetermined column direction, the trenches are disposed at both sides in a row direction orthogonal to the column direction in a plan view, extend in the column direction, and form meandering lines each connecting a plurality of curved portions so that a predetermined gap in the row direction is formed respectively between adjacent trenches extending in the column direction and between the trenches and the body contact regions.

4 Claims, 4 Drawing Sheets

SEMICONDUCTOR DEVICE

BACKGROUND OF THE INVENTION

1. Field of the Invention

The present invention relates to a semiconductor device including a vertical MOSFET having a trench gate structure.

2. Description of Related Art

For example, a VDMOSFET (Vertical Double diffused Metal Oxide Semiconductor Field Effect Transistor) with a trench gate structure is known as a power MOSFET having low ON resistance characteristics.

For example with a semiconductor device including an N-channel VDMOSFET having a trench gate structure, an N-type epitaxial layer is laminated on an $N^+$ (high concentration N)-type substrate. A P-type body region is formed in a top layer portion of the epitaxial layer. A trench is formed by digging in from a top surface of the body region. In the trench, a gate electrode is embedded via a gate insulating film. Further, an $N^+$-type source region and a $P^+$ (high concentration P)-type body contact region, penetrating through the source region in a thickness direction, are formed in a top layer portion of the body region. By grounding the source region and the body contact region and controlling a potential of the gate electrode while applying a positive voltage of a suitable magnitude to a drain electrode formed on a rear surface of the $N^+$-type substrate, a channel is formed near an interface of the gate insulating film (trench) in the body region and a current flows between the source region and the drain electrode.

With this type of VDMOSFET, a layout design of the trenches (gate electrodes) is being examined to enlarge a channel area per unit cell area and thereby reduce an ON resistance.

FIG. 4 is a schematic plan view of a layout of gate electrodes and body contact regions in a conventional semiconductor device.

With the conventional semiconductor device, a plurality of body contact regions 41 are formed in a zigzag alignment in a plan view. With respect to a column formed by the body contact regions 41 aligned in a predetermined direction Y (referred to as the "column direction Y" hereinafter in this section), gate electrodes 42 are disposed at both sides in a row direction X orthogonal to the column direction Y. Each gate electrode 42 extends in the column direction Y and is bent at right angles repeatedly and alternately to respective sides in the row direction X so that gaps D, equivalent to a width in the row direction X of the body contract region 41, are formed in the row direction X between the gate electrodes 42 and the gate electrodes 42 that are adjacent in the row direction X and between the gate electrodes 42 and the body contact regions 41.

With this configuration, in comparison to a configuration where body contact regions are formed in an array in a plan view and rectilinearly extending gate electrodes are formed between respective columns formed by the body contact regions that are aligned in the column direction, a gate width (total length of a gate in a plan view) in a single unit cell is increased in correspondence to the bending of the gate electrodes and the channel area per unit cell area is thus increased. The ON resistance can thus be reduced.

However, because the structure shown in FIG. 4 has corner portions due to the bending of the gate electrodes 42 at right angles, when a stress is applied to the semiconductor device, the stress may concentrate at the corner portions and cause disconnection of the gate electrodes 42.

SUMMARY OF THE INVENTION

An object of the present invention is to provide a semiconductor device that enables a gate width to be increased while avoiding localized concentration of stress on gate electrodes.

A semiconductor device according to one aspect of the present invention includes: a body region of a first conductive type; trenches formed by digging in from a top surface of the body region; gate electrodes embedded in the trenches; source regions of a second conductive type formed at sides of the trenches in a top layer portion of the body region; and body contact regions of the first conductive type, penetrating through the source regions in a thickness direction and contacting the body region. The body contact regions are formed in a zigzag alignment in a plan view. With respect to a column formed by the body contact regions aligned in a predetermined column direction, the trenches are disposed at both sides in a row direction orthogonal to the column direction in a plan view, extend in the column direction, and form meandering lines each connecting a plurality of curved portions so that a predetermined gap in the row direction is formed respectively between adjacent trenches and between the trenches and the body contact regions.

With this configuration, the trenches in which the gate electrodes are embedded are formed by digging in from the top surface of the body region of the first conductive type. In the top layer portion of the body region, the source regions of the second conductive type are formed at the sides of the trenches. The body contact regions of the first conductive type are formed so as to penetrate through the source regions in the thickness direction. The body contact regions are disposed in the zigzag alignment in a plan view. With respect to the column formed by the body contact regions aligned in the predetermined column direction, the trenches are disposed at both sides in the row direction orthogonal to the column direction in a plan view. Each trench extends in the column direction and forms a meandering line connecting the curved portions so that the predetermined gap in the row direction is formed respectively between adjacent trenches and between the trenches and the body contact regions.

Thus, in comparison to a configuration where body contact regions are formed in an array in a plan view and rectilinearly extending gate electrodes are formed between respective columns formed by the body contact regions that are aligned in the column direction, a gate width (total length of a gate in a plan view) in a single unit cell can be increased in correspondence to the meandering of the gate electrodes and a channel area per unit cell area can thus be increased. Consequently, an ON resistance can be reduced. Further, because the trenches do not have corner portions, when a stress is applied to the semiconductor device, localized concentration of stress on the gate electrodes embedded in the trenches can be prevented.

A semiconductor device according to another aspect of the present invention includes: a body region of a first conductive type; trenches formed by digging in from a top surface of the body region; gate electrodes embedded in the trenches; source regions of a second conductive type formed at sides of the trenches in a top layer portion of the body region; and body contact regions of the first conductive type, penetrating through the source regions in a thickness direction and contacting the body region. The body contact regions are formed in a zigzag alignment in a plan view. With respect to a column formed by the body contact regions aligned in a predetermined column direction, the trenches are disposed at both sides in a row direction orthogonal to the column direction in a plan view, extend in the column direction, and form meandering lines each connecting a plurality of bent portions so that a predetermined gap in the row direction is formed respectively between adjacent trenches and between the trenches and the body contact regions. The bent portions are bent at an inner angle greater than 90 degrees.

With this configuration, the trenches in which the gate electrodes are embedded are formed by digging in from the top surface of the body region of the first conductive type. In the top layer portion of the body region, the source regions of the second conductive type are formed at the sides of the trenches. The body contact regions of the first conductive type are formed so as to penetrate through the source regions in the thickness direction. The body contact regions are disposed in the zigzag alignment in a plan view. With respect to the column formed by the body contact regions aligned in the predetermined column direction, the trenches are disposed at both sides in the row direction orthogonal to the column direction in a plan view. Each trench extends in the column direction and forms a meandering line connecting the bent portions so that the predetermined gap in the row direction is formed respectively between adjacent trenches and between the trenches and the body contact regions.

Thus, in comparison to the configuration where body contact regions are formed in an array in a plan view and the rectilinearly extending gate electrodes are formed between the respective columns formed by the body contact regions that are aligned in the column direction, the gate width (total length of the gate in a plan view) in a single unit cell can be increased in correspondence to the meandering of the gate electrodes and the channel area per unit cell area can thus be increased. Consequently, the ON resistance can be reduced. Further, because the bent portions of the trenches are bent at the inner angle of greater than 90 degrees, when a stress is applied to the semiconductor device, localized concentration of stress on the gate electrodes embedded in the trenches can be prevented.

As long as the inner angle is greater than 90 degrees, the bent portions may, for example, be bent at an inner angle of 120 degrees.

The foregoing and other objects, features, and effects of the present invention will become more apparent from the following detailed description of the embodiments with reference to the attached drawings.

DETAILED DESCRIPTION OF PREFERRED EMBODIMENTS

Embodiments of the present invention shall now be described in detail with reference to the attached drawings.

Figure 1:
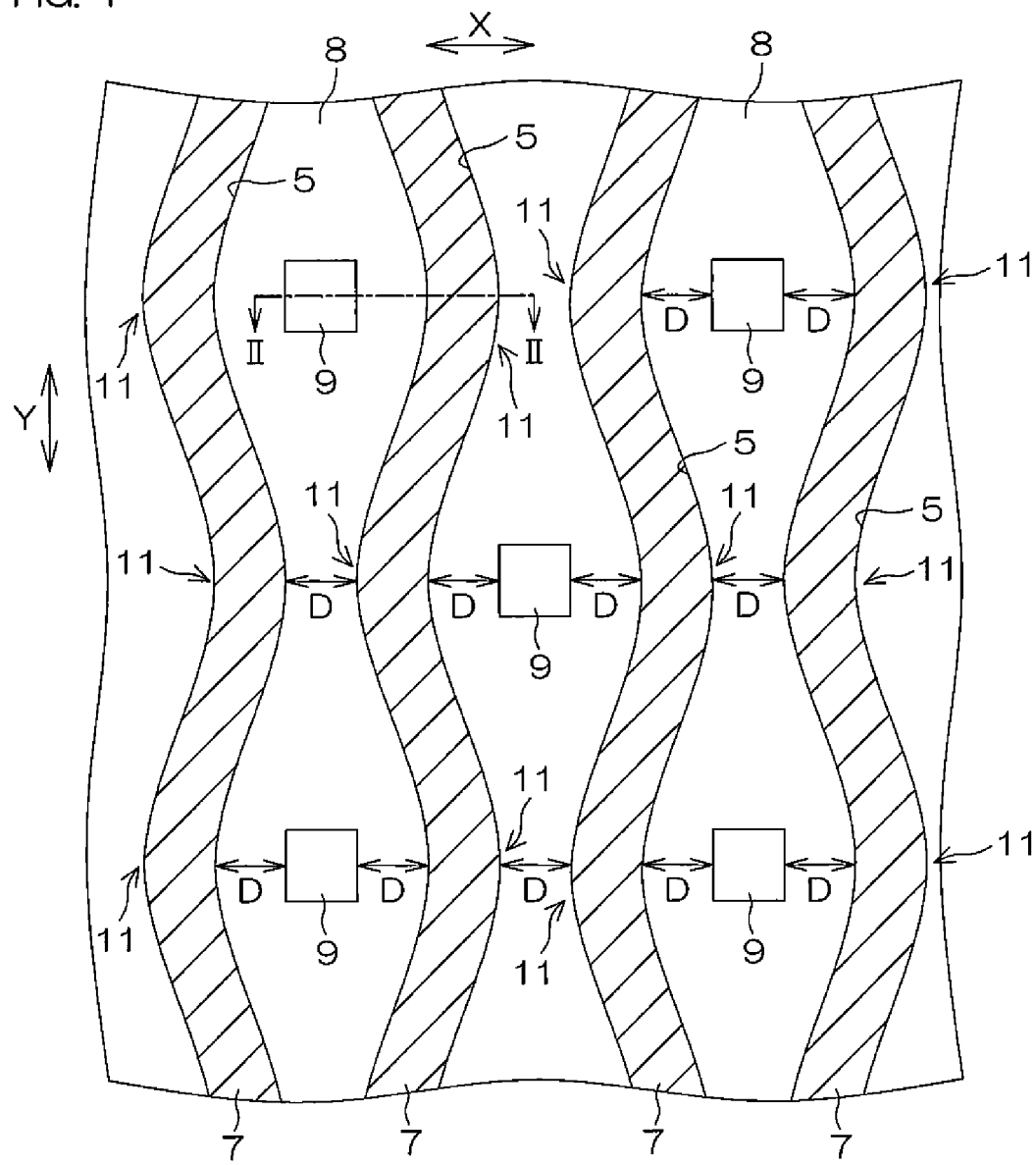
FIG. 1 is a schematic plan view of a layout of gate electrodes and body contact regions in a semiconductor device according to a first embodiment of the present invention.
Figure 2:
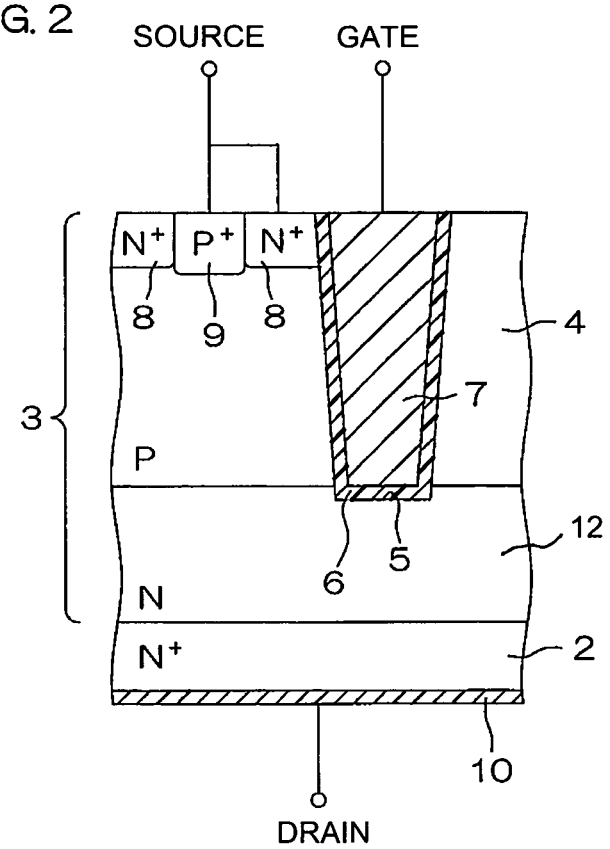
FIG. 2 is a schematic sectional view taken on sectioning line II-II shown in FIG. 1.

FIG. 1 is a schematic plan view of a layout of gate electrodes and body contact regions in a semiconductor device according to a first embodiment of the present invention. FIG. 2 is a schematic sectional view taken on sectioning line II-II shown in FIG. 1.

As shown in FIG. 2, the semiconductor device 1 includes an $N^+$-type semiconductor substrate 2 made of silicon. An N-type epitaxial layer 3 made of silicon is formed on the semiconductor substrate 2.

A P-type body region 4 is formed in a top layer portion of the epitaxial layer 3. Trenches 5 are formed by digging in from a top surface of the epitaxial layer 3. The trenches 5 are tapered and penetrate through the body region 4 and deepest portions thereof reach an N-type region 12 of the epitaxial layer 3 below the body region 4. Inside each trench 5, a gate insulating film 6 is formed so as to cover an entire inner surface thereof. Inside each trench 5, a gate electrode 7 is embedded by completely filling the inner side of the gate insulating film 6 with a polysilicon doped with a high concentration of an N-type impurity.

In a top layer portion of the body region 4, $N^+$-type source regions 8 are formed at sides of the trenches 5. Further, $P^+$-type body contact regions 9 are formed to penetrate through the source regions 8.

A drain electrode 10 is formed on a rear surface of the semiconductor substrate 2.

By grounding the source region 8 and the body contact region 9 and controlling a potential of the gate electrode 7 while applying a positive voltage of a suitable magnitude to the drain electrode 10, a channel can be formed near an interface of the gate insulating film 6 (trench 5) in the body region 4 to flow a current between the source region 8 and the drain electrode 10.

As shown in FIG. 1, the body contact regions 9 have square shapes and are disposed in a zigzag alignment in a plan view. More specifically, the body contact regions 9 form a plurality of columns and are disposed at a fixed pitch in a column direction Y in each column. In two columns that are mutually adjacent in a row direction X orthogonal to the column direction Y, the body contact regions 9 forming one column and the body contact regions 9 forming the other column are in a positional relationship of being shifted by a half pitch (half of the pitch at which the body contact regions 9 are positioned in the column direction).

With respect to the column formed by the body contact regions aligned in the column direction Y, the trenches 5 (gate electrodes 7) are disposed at both sides in the row direction X in a plan view. Each trench 5 extends in the column direction Y and forms a meandering line connecting a plurality of curved portions 11 so that a fixed gap D in the row direction X is formed respectively between adjacent trenches 5 and between the trenches 5 and the body contact regions 9.

Thus, in comparison to a configuration where body contact regions are formed in an array in a plan view and rectilinearly extending gate electrodes are formed between respective columns formed by the body contact regions that are aligned in the column direction, a gate width (total length of a gate in a plan view) in a single unit cell can be increased in correspondence to the meandering of the gate electrodes 7 and a channel area per unit cell area can thus be increased. Consequently, an ON resistance can be reduced. Further, because the trenches 5 do not have corner portions, when a stress is applied to the semiconductor device 1, localized concentration of stress on the gate electrodes 7 embedded in the trenches 5 can be prevented.

Figure 3:
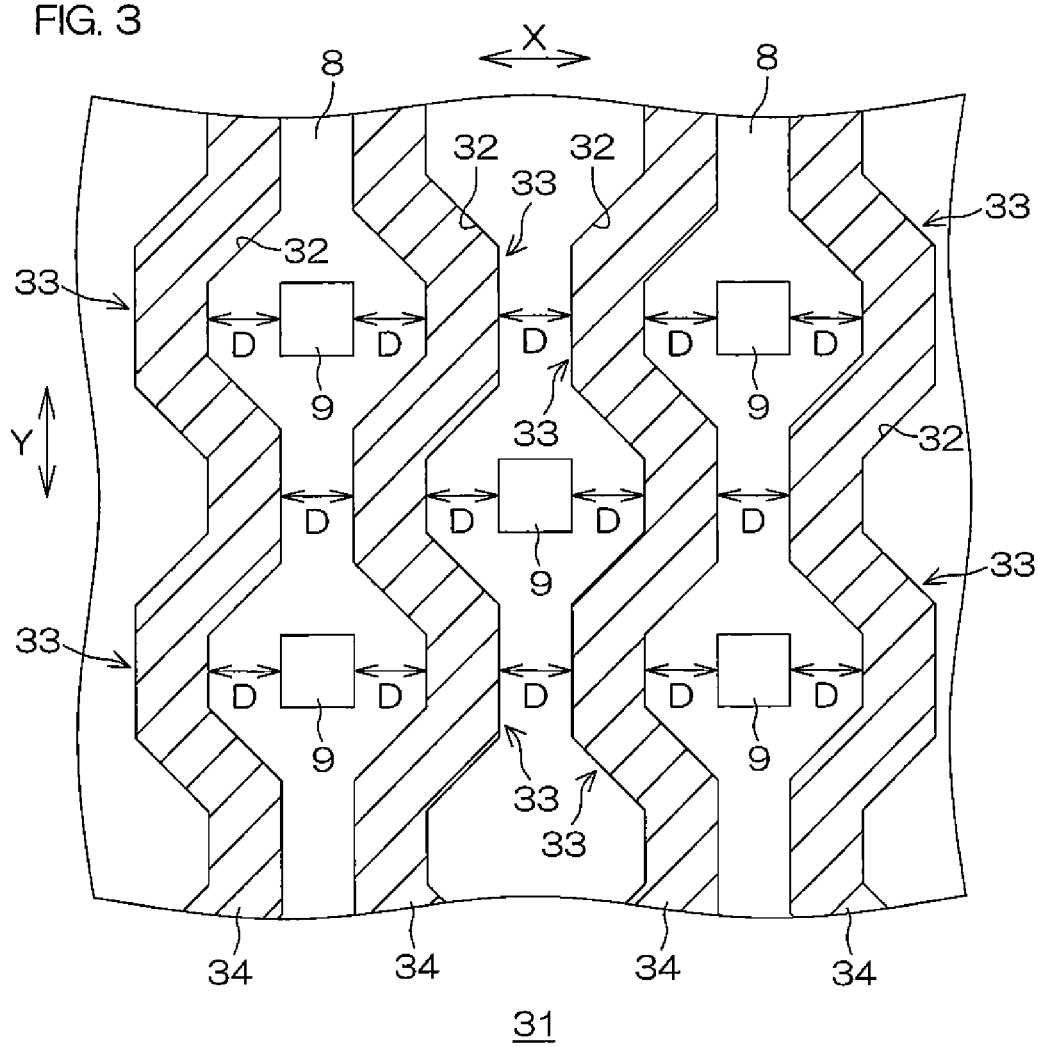
FIG. 3 is a schematic plan view of a layout of gate electrodes and body contact regions in a semiconductor device according to a second embodiment of the present invention.
Figure 4:
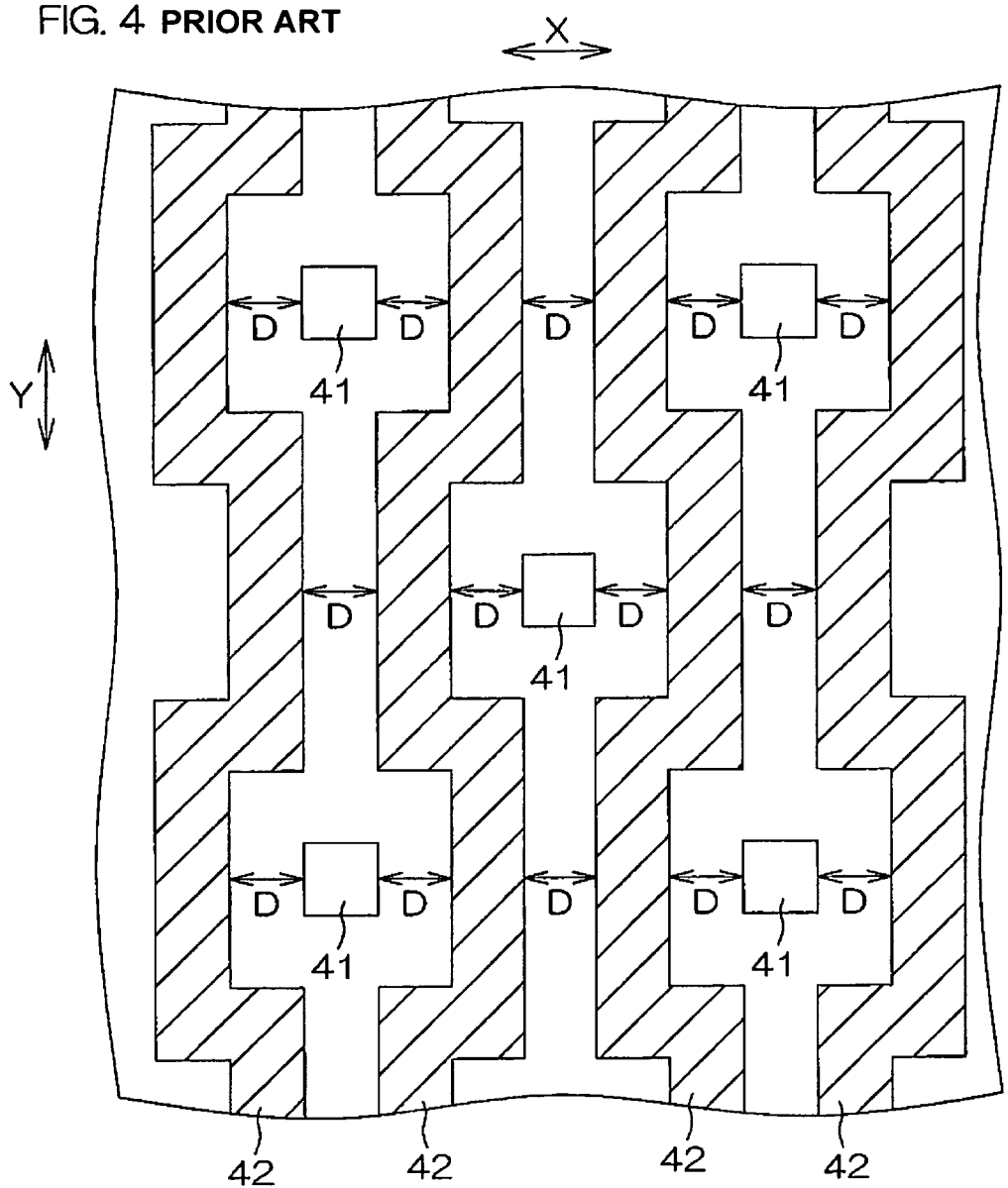
FIG. 4 is a schematic plan view of a layout of gate electrodes and body contact regions in a conventional semiconductor device.

FIG. 3 is a schematic plan view of a layout of gate electrodes and body contact regions in a semiconductor device according to a second embodiment of the present invention.

In FIG. 3, portions equivalent to respective portions shown in FIG. 1 are provided with the same reference symbols as these portions.

In the semiconductor device 31, trenches 32 extend in the column direction Y and form meandering lines connecting a plurality of bent portions 33 so that the fixed gap D in the row direction X is formed respectively between adjacent trenches 32 and between the trenches 32 and the body contact regions 9. Each bent portion 33 has a shape that bends to one side in the row direction X at an inner angle of 120 degrees with respect to a portion extending in the column direction Y of the trench 32, then extends in the column direction Y, and then bends to the other side in the row direction X at an inner angle of 120 degrees with respect to the portion extending in the column direction Y.

Thus, in comparison to a configuration where body contact regions are formed in an array in a plan view and rectilinearly extending gate electrodes are formed between respective columns formed by the body contact regions that are aligned in the column direction, the gate width (total length of the gate in a plan view) in the single unit cell can be increased in correspondence to the meandering of the gate electrodes 7 and the channel area per unit cell area can thus be increased. Consequently, the ON resistance can be reduced as with the configuration shown in FIG. 1. Further, because the bent portions 33 of the trenches 32 are bent at the inner angle greater than 90 degrees, when a stress is applied to the semiconductor device 31, localized concentration of stress on the gate electrodes 34 embedded in the trenches 32 can be prevented.

In the semiconductor devices 1 and 31 according to the respective embodiments, a configuration may be employed with which the conduction types (P-type, N-type) of the respective semiconductor portions are inverted with respect to the configuration described above.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-255345, filed with the Japan Patent Office on Sep. 28, 2007, the disclosure of which is incorporated herein by reference.

What is claimed is:

1. A semiconductor device, comprising:
   an $N^+$-type semiconductor substrate made of silicon, the substrate having top and bottom sides;
   an N-type epitaxial layer made of silicon formed on the top side of the substrate;
   a P-type body region formed on the epitaxial layer, the body region having trenches that extend from a top side of the body region to the epitaxial layer;
   gate insulating films, each of the gate insulating films covering the surface of a respective one of the trenches to form an insulating trough;
   a plurality of gate electrodes made of polysilicon doped with a high concentration of an N-type impurity, each of the gate electrodes completely filling a respective one of the insulating troughs with the gate electrodes coming up to the top of the troughs;
   $N^+$-type source regions formed in a top layer portion of the body region adjacent the troughs;
   $P^+$-type body contact regions disposed within the source regions and penetrating through the source regions in a depth direction; and
   a drain electrode on the bottom side of the substrate,
   wherein the body contact regions are disposed in a plurality of columns that extend at a fixed pitch in a column Y direction when seen in a plan view,
   wherein, in a pair of columns that are adjacent one another in a row direction X that is orthogonal to the column direction Y, the body contact regions forming one of the columns and the body contact regions forming the other of the columns are in a positional relationship of being shifted in the column Y direction by half of the fixed pitch,
   wherein the trenches extend in the column Y direction, with each column of body contact regions having trenches disposed at both sides thereof,
   wherein the trenches are disposed in meandering lines having curved portions, with gaps having a fixed gap width D existing in the row direction X between adjacent trenches and between the trenches and the body contact regions, and
   wherein the body contact regions are substantially square in shape, with sides parallel to the row direction X or the column direction Y, when seen in a plan view.

2. The semiconductor device of claim 1, wherein the semiconductor device is a vertical MOSFET having a trench gate structure.

3. The semiconductor device of claim 1, wherein bottoms of the trenches are in the N-type epitaxial layer.

4. The semiconductor device of claim 3, wherein the $P^+$-type body contact regions are much deeper than the $N^+$-type source regions surrounding the contact regions.